United States Patent
Hellberg et al.

(10) Patent No.: US 7,058,136 B1
(45) Date of Patent: Jun. 6, 2006

(54) METHOD AND APPARATUS FOR GENERATING AN RF SIGNAL

(75) Inventors: Richard Hellberg, Huddinge (SE); Tony Fondén, Spånga (SE); Spendim Dalipi, Sollentuna (SE)

(73) Assignee: Telefonakitiebolaget L M Ericsson (publ), Stockholm (SE)

( * ) Notice: Subject to any disclaimer, the term of this patent is extended or adjusted under 35 U.S.C. 154(b) by 569 days.

(21) Appl. No.: 09/714,871

(22) Filed: Nov. 17, 2000

(30) Foreign Application Priority Data

Nov. 18, 1999 (EP) .................................. 99850172

(51) Int. Cl.
*H04L 27/04* (2006.01)

(52) U.S. Cl. ...................... 375/295; 375/222; 375/242; 375/260; 370/442; 370/225

(58) Field of Classification Search ................. 375/295, 375/242, 329, 222, 260; 325/24; 370/442, 370/225

See application file for complete search history.

(56) References Cited

U.S. PATENT DOCUMENTS 4,087,751 A * 5/1978 Kato et al. ................... 375/222
5,450,444 A 9/1995 Miki et al.
6,094,458 A * 7/2000 Hellberg ..................... 375/242

FOREIGN PATENT DOCUMENTS

| EP | 0 426 560 A | 5/1991 |
| WO | 98/11683 A | 3/1998 |

\* cited by examiner

*Primary Examiner*—Stephen Chin
*Assistant Examiner*—Eva Zheng
(74) *Attorney, Agent, or Firm*—Nixon & Vanderhye P.C.

(57) ABSTRACT

To generate a high-power modulated radio frequency signal $S_{OUT}$ from an input low or medium frequency information signal $S_{IN}$, the information signal is pulse-shaped in a quantifier to form a digital signal $S_D$ having discrete signal values. The digital signal is processed in a switching unit comprising switches for each signal value, in radio frequency wave generators for each switch generating carrier waves of radio frequency, and in control circuits for each switch to control the opening and closing thereof. When a switch is closed, its associated generator is connected to the output line of the switching unit, and when it is opened, the generator is disconnected therefrom. In the switching unit, a switched radio frequency signal $S_{SW}$ carrying the information of the input signal is formed by opening and closing the switches when the digital signal adopts or does not adopt, respectively, the signal value associated with the respective switch. The switching is thus controlled by the signal values of the digital signal. The switched signal on the output line of the switching unit is filtered by a filter for achieving the high-power, modulated, radio frequency signal $S_{OUT}$.

16 Claims, 4 Drawing Sheets

METHOD AND APPARATUS FOR GENERATING AN RF SIGNAL

The present invention relates generally to generating a modulated RF signal, and more particularly to modulation and amplification of a low or medium frequency information signal to produce a high-power radio frequency (RF) signal.

BACKGROUND

The development in the radio communication field during the recent years has created an increased need for high-power radio frequency amplifiers. One reason for this is the increased use of modulation schemes using time-dependent envelopes, like QAM (Quadrature Amplitude Modulation), OFDM (orthogonal frequency division modulation), and CDMA (Code Division Multiple Access). Another reason is the development towards multi-carrier radio (MCR).

In cellular networks, terminals can be connected to radio base stations. In a radio base station, there is a need for a linear nigh-power amplifier in the transmitter section to provide each radio channel with sufficient power to reach the outer limits of the cell covered by the base station. Traditionally there has been a trade-off between efficiency and linearity in radio frequency power amplifiers. E.g. C-type amplifiers have a high efficiency but have an insufficient linearity, whereas e.g. A-type amplifiers are very linear but have a low efficiency.

When the same amplifier is used for simultaneous amplification of several information signals modulated on different carrier waves or when linear modulation is used, such as QAM, a high linearity is required. This is because, in this case, it is essential that all phase and amplitude positions of the signal components involved are maintained in the amplification. If many carriers are amplified in a single amplifier, the envelope of the total signal will be time-dependent even if the individual signals are not. If linearity is not achieved, inter-modulation between the signal components might occur or the spectrum of the amplified signal sum might broaden, resulting in an interference with signals on other channels. It has, therefore, been particularly problematic to find solutions for e.g. MCR (Multi-Carrier Radio) base stations maintaining a high efficiency due to the very stringent linearity requirements at the same time as high power is needed. In addition, the relatively large bandwidth makes a solution for this case particularly difficult.

The published International patent application WO 98/11683, inventors L. Hellberg et al., discloses a method for generating a moderately wide-band (i.e. including a MCR signal) high-power RF signal with a high efficiency and linearity. In this method, a sigma-delta modulator is used to generate a digital signal from an information signal followed by digital up-mixing and subsequent switching and band-pass filtering. The sigma-delta modulation transforms the analog (or highly multi-level digital) signal to a signal containing only M (preferably, but not necessarily, equally spaced) levels by a quantization process. A band-pass filter then rejects the so-called quantization noise generated in this process. The switching process provides the amplification. The input of the band-pass filter is connected to M different constant electrical potentials via M switches. At a given time, one and only one switch is closed, and all the others are opened. The digital control signal (the digitally up-mixed sigma-delta coded base-band signal) determines which switch is closed. The sigma-delta amplifier has a switching frequency equal to twice the "carrier" frequency. The switches are connected to DC voltages.

If ideal switches (and an ideal band-pass filter) are used, the amplifier would have a 100% efficiency and linearity. Real switches are, however, not ideal and therefore they will dissipate power and a 100% efficiency is not obtained. Power will be dissipated due to voltage-drops across the closed switches and leakage current through the opened switches.

Furthermore, the switches have finite transition times between the closed and opened states. This results in a problem of switching transients. If, during some period during a switching transient, two switches are simultaneously closed, i.e. are in a low impedance state, an almost short-circuited power supply would result.

If, on the other hand, during a switching transient, all switches are simultaneously open, i.e. are in a high-impedance state, the band-pass filter would create a voltage transient. The band-pass filter must have a high input impedance for out-of-band signals. For this reason, it can be considered as a constant current generator during the short interval of time of a switching transient. This constant current passes the high-impedance switches, creating a high-voltage transient. This dissipates transient power, may create non-linearities, and even degrade the lifetime of the switches. It will also be more difficult to get the required selectivity from the band-pass filter since it will see a time-varying impedance.

One way to reduce the transient problems could be to use a faster switch. However, there is often a trade-off between speed, the conductivity of the closed switches (for a given minimum "off-resistance" in the opened state), and the required control-signal power. Thus, small transient losses may imply e.g., higher ohmic losses in the steady state "closed" state (or higher control-signal power).

SUMMARY OF THE INVENTION

The present invention relates to a method and apparatus for generating a modulated radio frequency (RF) signal. It is especially concerned with methods and apparatus for modulation and amplification of a low or medium frequency information signal to produce a high-power RF signal.

It is a general object of the present invention is to overcome the transient problems when a high-power RF signal is generated by quantization and switching.

Another object of the present invention is to use lower power for controlling switches by means of lowering the switching frequency.

The present invention achieves this by generating a high-power modulated RF signal from a low or medium frequency information signal. This is carried out by pulse-shaping the information signal by a quantifier, e.g. a sigma-delta modulator, to form a digital signal having discrete signal values or signal levels or having values indicating discrete signal levels, generating one or more carriers of radio frequency, and modulating the radio frequency carriers by the digital signal. Modulation, as well as amplification, is achieved by making the digital signal control switches, connecting different carrier voltages to a common output. This arrangement works, in principle, as an analog mixer of the digital signal with a carrier, in accordance with a given information content of the digital signal. The mixed signal is then band-pass filtered to remove unwanted spectral components such as side bands and quantization noise.

The present invention solves the problem of switching-transients by connecting alternating carrier voltages instead of prior art DC voltages.

At regular intervals in time the carrier voltages have zero crossing, i.e. they have momentarily the value zero volt. If the switching events coincide with the zero crossings the switching-transient problem is solved.

Thus, consider a switching event where a switch "A" is at first closed and another switch "B" open. Then choose to perform the switching by first closing switch "B" and only slightly later opening "A". Thus both switches are momentarily closed during the switching-transient, but this will not short-circuit the carrier generator, the "power supply", since the timing for the switching event has been chosen to coincide with a zero-crossing of the carrier voltage. This results in that the band-pass filer always will be connected to a low impedance, and therefore no switching-transient will occur. In a preferred embodiment, it is possible to choose the switching events to take place at the zero-crossings, provided that the carrier frequency is a multiple of the quantifier output sampling frequency. The carrier voltage does not have to be a sinusoidal. In some embodiments it could be possible to choose the harmonic and sub-harmonic content of the carrier so that it stays close to zero for some time-interval around the switching events.

In addition, the present invention gives a lower switching-frequency, i.e. the time interval between successive switching events is longer. The switching frequency in the present invention is preferably equal to the output sampling frequency of the quantifier, which typically is twice the base-band width times the oversampling ratio, plus some guard interval.

Advantages that can be achieved include a lower switching-frequency and reduced power necessary for controlling the switches.

BRIEF DESCRIPTION OF THE DRAWINGS

The foregoing and other objects, features, and advantages of the invention will be apparent from the following description of preferred embodiments as illustrated in the accompanying drawings in which reference characters refer to the same parts throughout the various views. The drawings are not necessarily to scale with emphasis being placed upon illustrating the principles of the invention. In the drawings.

DETAILED DESCRIPTION

Figure 1:
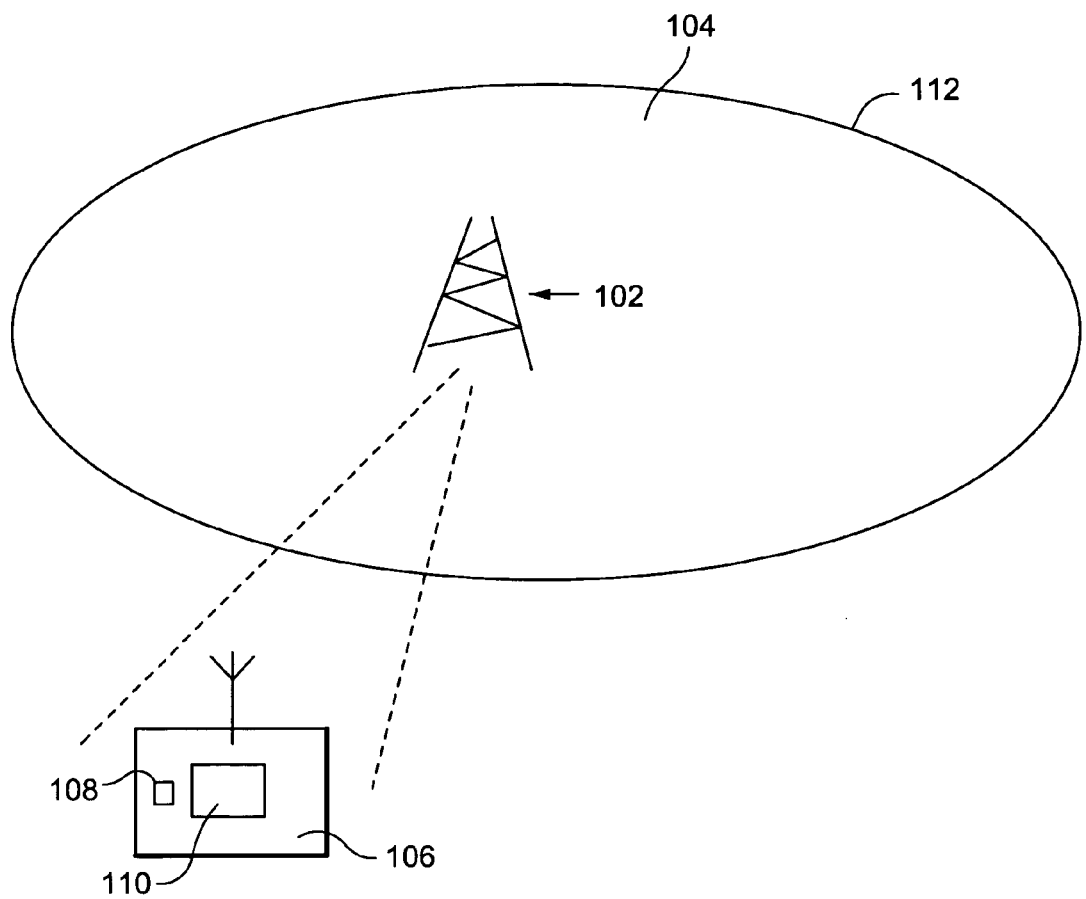
FIG. 1 is a schematic view of a cell comprised in a mobile telecommunication network, the cell including a radio base station.

A part of a radio communication system 100, see FIG. 1, includes at least one radio base station 102 covering a cell 104. The base station comprises a transmitter section 106 which in turn comprises a quantifier 108 and a switching unit 110 to provide each radio channel of the base station with sufficient power to reach outer limits 112 of the cell 104.

Figure 2:
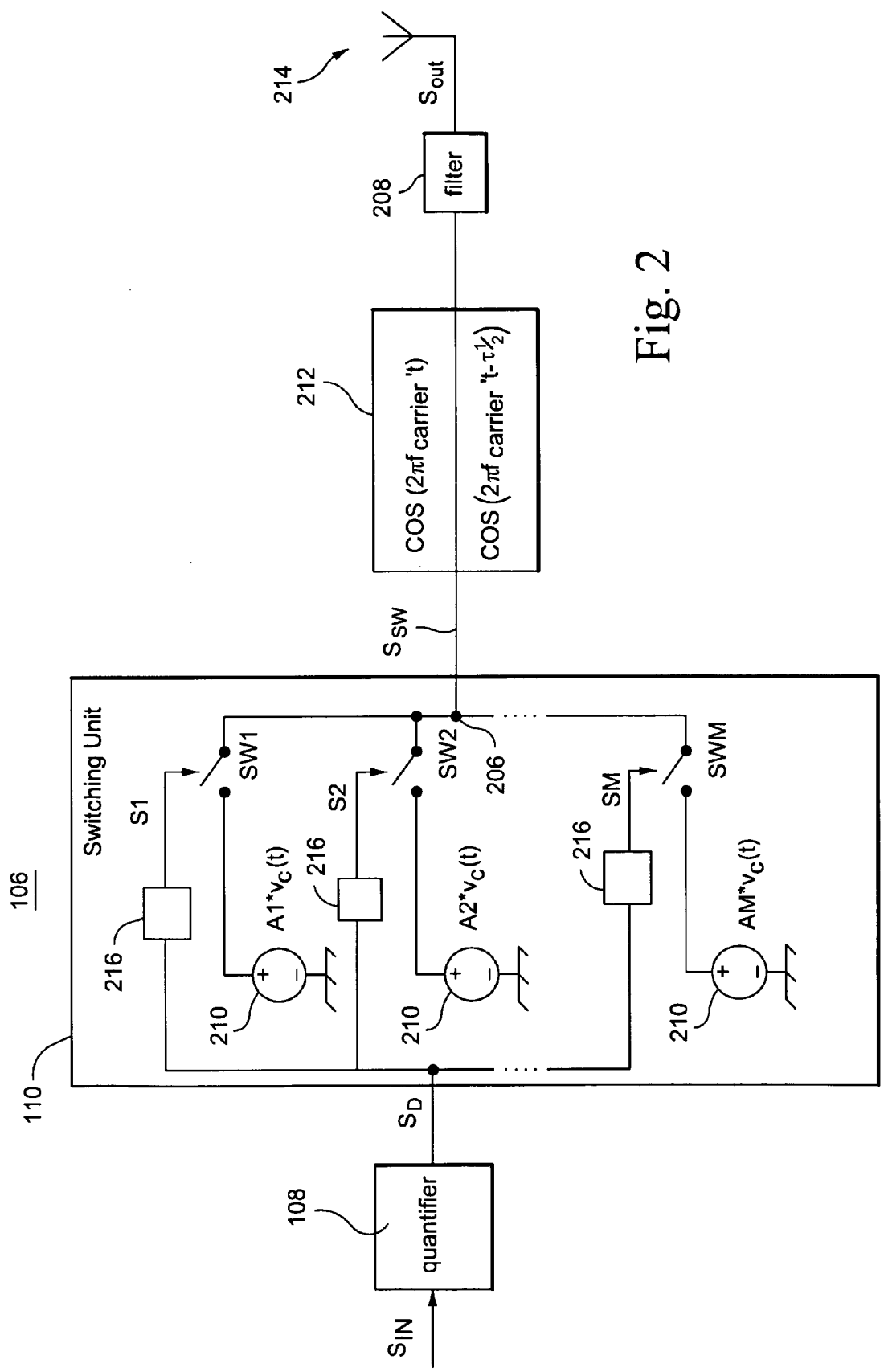
FIG. 2 is a circuit diagram of a transmitter section used in the base station of FIG. 1.

In FIG. 2 a first embodiment of the transmitter section 106 is shown receiving an incoming low frequency or medium frequency, base-band, information signal $S_{IN}$ which is quantified in a quantifier 108 for generating a digital signal $S_D$ having or indicating "M" discrete signal levels, i.e. $S_1, S_2, \ldots, S_M$. The digital signal $S_D$ represents a version of the incoming information signal $S_{IN}$, the base-band signal, that can be analog or digital, simple or quadrature shifted into two signal components. The digital signal $S_D$ is generally produced by a procedure involving sampling in the quantifier and thus has a sampling frequency $f_s$ and generally, it may have different shapes and forms and be of different types. The discrete values comprised in or indicated by the digital signal $S_D$ comprise one or more bits. The quantifier 108 could be for example a sigma-delta modulator, such as that described in the cited WO 98/11683, which is incorporated by reference herein. The sigma-delta modulator transforms an input signal to a signal having at least two levels. The digital signal $S_D$ has a small number of bits which is often the lowest possible, i.e. M=2 (one bit) so that, in this case there are only two quantization levels, which can be logically denoted by e.g. −1 and +1. The reduction of the number of bits in the sample stream results in a distortion of an incoming multilevel digital signal and also of an incoming analog signal. The distortion can be approximated as "noise", so called quantization noise, and can be eliminated by band-pass filtering.

The digital signal $S_D$ which has M levels or indicates M signal levels is provided to the control terminals of M switches SW1, SW2, . . . , SWM of the switching unit 110. The switches are each connected to respective radio frequency carrier generators 210 so that upon closing a switch, the corresponding carrier becomes available at a common output 206 of the switches, the output being the output line of the switching unit. The switches are controlled in accordance with the value of or indicated by the digital signal $S_D$ so that if the value of the digital signal $S_D$ is, for instance, equal to 1 then SW1 is closed, and all other switches opened. Hence, a given value of digital signal $S_D$ determines the radio frequency carrier voltage $Am^*V_c(t)$ which will be available at the common output 206. The actual control of each switch is preferably performed by coupling the digital signal to the respective switch through a switching control section, which can comprise logical control circuits 216, which are thus connected to receive the digital signal $S_D$ and to output a control signal to the control terminal of the respective switch. The radio frequency carriers may be represented in the form $A1^*V_c(t), A2^*V_c(t), \ldots, AM^*V_c(t)$, where A1, A2, . . . , AM represent carrier amplitudes and the carrier voltage function $V_c(t)$ represents their general time dependence. The function $V_c(t)$ can be formed by different functions and may have different shapes. The amplitudes can correspond to the values of or indicated by the digital signal $S_D$, i.e. the output values of the quantifier. In the simplest case the carrier voltage $V_c(t)$ is a sinusoidal function, $V_c(t)=\cos(2\pi f_{carrier} t)$. If the carrier wave voltage $V_c(t)$ is sinusoidal and varies between a top plus level L1, see the diagram of FIG. 4d, and a bottom minus level—L1, the carrier voltage has a zero crossing L0 occurring at regular intervals in time, i.e. it has at some periodically repeated instants the value of zero volt. The switching will generate a switched radio frequency signal $S_{SW}$ appearing at the common output 206 of the switching unit 110 since one and only one switch at a time is closed, except possibly for a short period during the switching transient when switches might be simultaneously closed. Unwanted noise in the combined signal can be eliminated by a band pass filter 208 connected to the common output 206. In summary, a high-power modulated radio frequency signal $S_{OUT}$ is generated from a low or medium frequency information signal $S_{IN}$ and it is sent out on an antenna 214, see also FIG. 1.

The switching unit 110 performs mixing and amplification of the digital signal $S_D$. The switches work as an analog high power mixer modulating the carrier signals by $S_D$.

When a given switch is closed, its associated carrier wave becomes available at the output resulting in high-power modulated RF signal of a given amplitude. The power of the switched signals depends on the carrier wave voltage, and amplification is achieved when the digital signal $S_D$ is used to switch a high power carrier wave.

The switching unit 110 thus converts the digital signal $S_D$ to the switched radio frequency signal $S_{SW}$ carrying the information. The switched signal $S_{SW}$ comprises an undesired spectrum, which can be removed by the filter 208. The generation of carrier waves of radio frequency in the generators 210 can be made in accordance with known methods. The easiest way is to generate a sinusoidal carrier. The generation of a non-sinusoidal carrier is more complex but has the advantage that it is possible to choose the carrier to stay close to zero for some finite time period at or around each of the switching events, see the waveform diagram of FIG. 4e. The switching events can generally be chosen to always take place at zero crossings of the carrier waves, provided that the harmonic frequency components of the carriers are multiples of the output sampling frequency $f_s$ of the quantifier 108.

Figure 3:
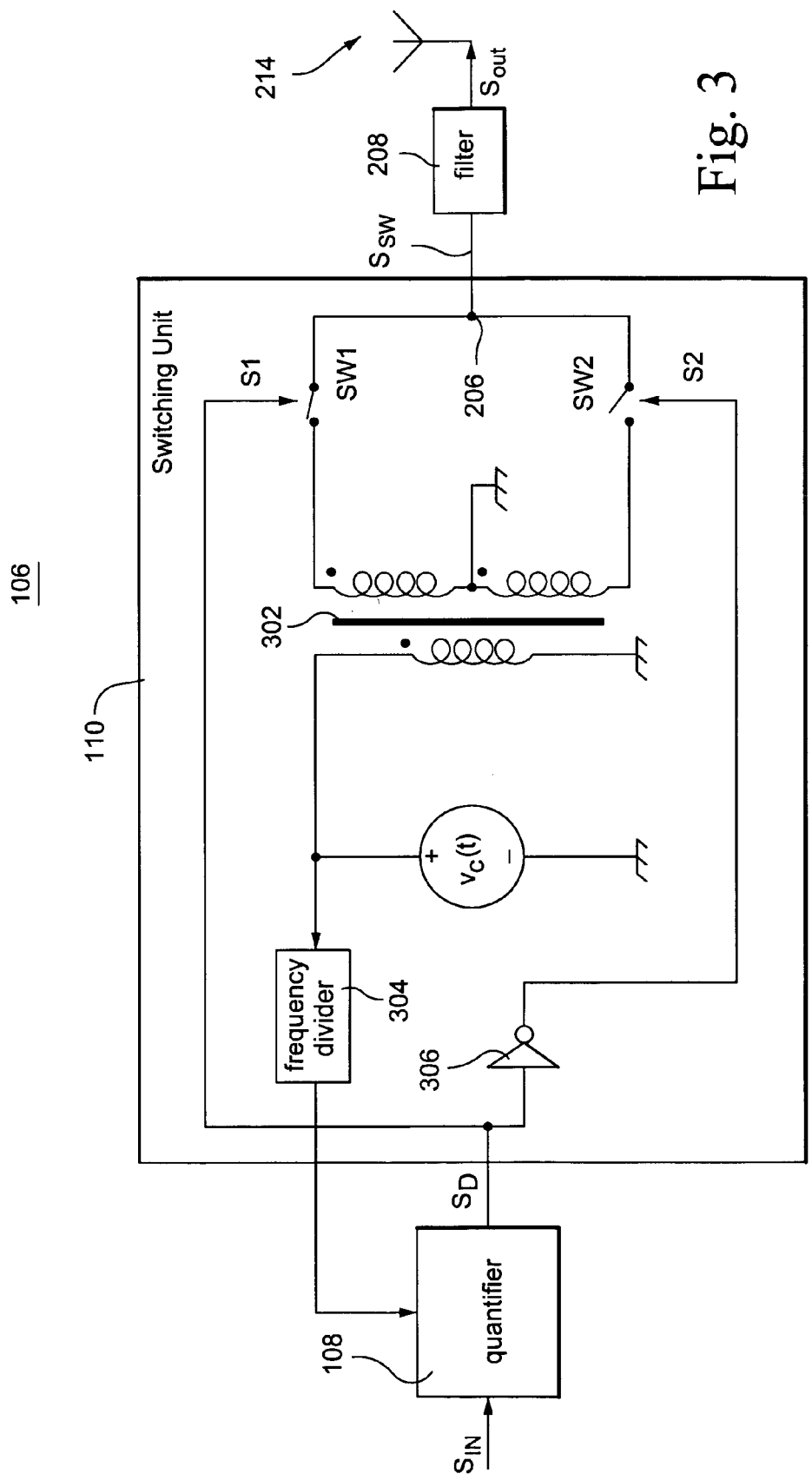
FIG. 3 is a circuit diagram of the transmitter section for two-valued quantified signal.
Figure 4:
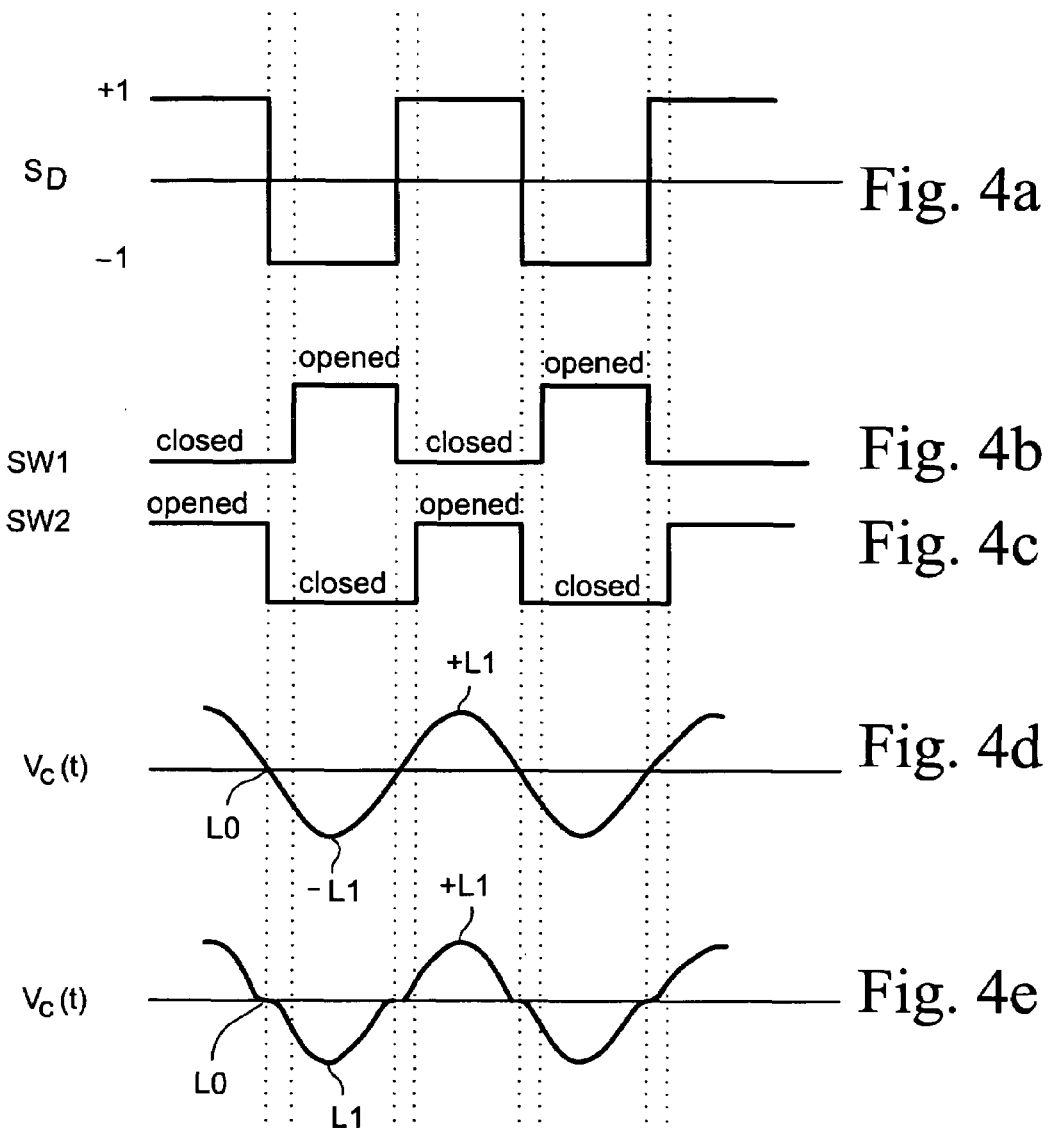
FIGS. 4a–4e are views of timing waveforms for different signals used in the transmitter section of FIG. 3.

FIG. 3 shows a possible implementation of a two-level system, i.e. a system in which M=2. This implementation uses a, supposedly ideal, transformer 302 having identical but oppositely connected secondary windings to generate the two carrier signals Vc(t) and −Vc(t), the transformer receiving on its primary side a voltage from a base generator generating a voltage vc(t). A first switch S1 is thus connected to an electric potential Vc(t) with respect to the ground, while a second switch SW2 is connected to an electric potential −Vc(t). The two switches are as above connected to the common output 206, which is connected to the input of the band-pass filter 208. The modulated RF signal SOUT from the filter 208 is used to feed the antenna 214. The digital signal SD from the quantifier 108, which has two levels indicating two different levels of the input signal, is provided to the control terminals of the two switches SW1 and SW2 of the switching unit 110. An inverting circuit 306 is connected in the output line from the quantifier 108 to the terminal of the second switch SW2. The digital signal SD thereby controls the switches in accordance with the value+1 or−1 of the digital signal. In the diagrams of FIGS. 4a–4c is shown that when the quantifier 108 outputs the logical value +1, the first switch SW1 is closed and the second switch SW2 is opened. When the quantifier outputs the logical level −1, the first switch SW1 is opened and the second switch SW2 is closed. A frequency divider 304 is connected to the output of the base generator connected to the primary side of the transformer 302 to provide a signal to the quantifier 108 controlling the sampling frequency thereof. Thereby the carrier generation is synchronised with the sampling frequency fs of the quantifier. The synchronising is done to ensure that the switching events always take place at zero crossings of the carrier signal. In this embodiment, a two level system is described. A well known fact of sigma-delta modulators which can be used as the quantifier is that a two-level system is less sensitive to mismatches in the electronic components in the modulators. Thus, an amplitude error, e.g. in one or both of the two carrier amplitudes between which the switching is made, does not introduce any distortion. In a three- or many-level system, however, distortion is created by deviations of the carrier amplitudes, between which the switching is made, from the nominal values of the amplitudes.

If the carrier wave voltage is sinusoidal, the modulated digital signal $S_D$ will be transposed so that a base-band frequency component of $F_b$ will end up at $F_c-F_b$ and $F_c+F_b$ where $F_c$ is the carrier frequency. The band-pass filter 208 placed after the forming of the switched signal $S_{SW}$ is used for rejecting the unwanted side bands (either $F_c-F_b$ or $F_c+F_b$ for all $F_{b-s}$ in the base band). The band-pass filter 208 also rejects the (frequency transposed) quantization noise from the quantifier 108.

Another way to reject the unwanted side-bands is by using an alternative cancellation arrangement (212) based on quadrature signals. In this case, two modulated base-band signals are used, identical as to a 90degrees phase-difference, e.g. $\cos(2\pi f_{carrier}t)$ and $\cos(2\pi f_{carrier}t-\pi/2)$. These two signals control the switches in two different mixers or switching units 110. The switching units comprise carrier generators generating carriers having a 90 degrees phase difference. The signals from the switching units are added either before or after the band-pass filter(s). In addition, in this arrangement, the (frequency transposed) quantization noise from the sigma-delta modulator is rejected by the band-pass filter(s).

A slightly different variant of this alternative would be to neither reject nor cancel either of the side-bands, but to use them as two linearly independent channels, and to use them as in the traditional quadrature phase I and Q arrangement. In addition, in this variant, the frequency transposed quantization noise from the modulator is rejected by the band-pass filter(s).

If the carrier is not sinusoidal and contains more than one frequency component, a replica of the modulated base-band signal will fall onto the band-pass filter. However, if all the frequency components of the carrier are integer multiples of the sampling frequency of the quantifier, all these components are aligned so that a particular base-band frequency component will be mapped onto the same radio frequency for all the replicas. The carrier may contain both harmonics and sub-harmonics of its fundamental frequency as long as all of them are integer multiples of the sampling frequency of the quantifier, since this carrier will not create any distortion of the resulting RF signal.

Though any number M<2 of equidistant or none-equidistant "carrier" amplitudes might be used, the most practical arrangement is to use only two levels, as in the circuit of FIG. 3, or three levels.

If switching events are chosen to coincide with the zero crossings, no switching-transient problems exist as will be explained in the following. A switching event is assumed to occur in apparatus having two switches, see FIG. 3, where one of the switches is closed and the other is opened. If the switching is performed so that the first switch is closed slightly before the second switch is opened, see FIGS. 4b, 4c, both switches are momentarily closed at the transient moment. This will not short-circuit the "power supply" as represented by the carrier generator, since the timing for the switching event has been chosen to coincide with a zero-crossing of the carrier voltage, at which moment there is no power supply. In such a switching strategy, the band-pass filter will at all times be connected to a low impedance, since one or both of the switches is/are closed.

In addition to solving the switching-transient problem, the switching units as described above also normally give a lower switching-frequency, i.e. the time interval between successive switching events is longer. It is equal to the output sampling frequency $f_s$ of the quantifier 108, e.g. twice the base bandwidth times the oversampling ratio plus some guard interval, since in the switching units the mixing of the carrier wave and the information signal, the coded base band signal, takes place at the switching event.

A bi-stable switch dissipates control signal power only when changing from one state to the other, i.e. from closed to opened and from opened to closed. For a quasi bi-stable switch, this is also true, to a good approximation. Thus, if bi-stable or quasi bi-stable switches are used, the required control signal power is proportional to the switching frequency. Because of the lower switching frequency of the apparatus as described above, which is equal to the output sampling frequency of the quantifier, it thus requires less power for the control of the switches, and gives a higher efficiency amplifier. This applies e.g. to a BOSS, a bi-stable optical controlled semiconductor switch, and a MOSFET, a metal oxide semiconductor field effect transistor. The required control-signal power is therefore proportional to the switching frequency. This results in less power required for controlling the switches, and thus gives a amplifier having a higher efficiency.

The switching unit as described herein can advantageously be used in all kinds of transmitters in which the signal has a time-dependent envelope. This includes in particular radio base stations using the MCR concept, but also handsets for various standards, modems for wireless local area networks (WLANs), etc.

The invention described above may be embodied in yet other specific forms without departing from the spirit or essential characteristic thereof. Thus, the present embodiments are to be considered in all respect as illustrative and not restrictive, the scope of the invention being indicated by the appended claims rather than by the foregoing description, and all chances which come within the meaning and range of equivalency of the claims therefore intended to be embraced therein.

What is claimed is:

1. A method of generating on an output line a high-power modulated radio frequency signal from a low or medium frequency information signal, comprising:
   pulse-shaping the information signal using sampling having a sampling frequency to form a digital signal having at least two discrete signal values;
   generating for each of the two discrete signal values a corresponding alternating current (AC) radio frequency carrier signal including a first AC radio frequency carrier signal for a first one of the two discrete signal values and a second different AC radio frequency carrier signal for a second one of the two discrete signal values;
   using each discrete signal value to control connecting its corresponding AC radio frequency carrier signal to the output line to produce a switched radio frequency signal carrying the information signal; and
   filtering the switched radio frequency signal for obtaining the high-power modulated radio frequency signal,
   wherein in connecting the different corresponding AC radio frequency carrier signals to the output line, the times at which the connecting of any of the different AC radio frequency carrier signals is started or ended are chosen to coincide with a moment at which the respective AC radio frequency carrier signal is equal to zero or is close to zero to avoid energy losses during the starting or ending of the connecting.

2. The method according to claim 1, wherein in the step of generating, the AC radio frequency carrier signals are generated to have frequencies being multiples of the sampling frequency of digital signal.

3. A method of generating on an output line a high-power modulated radio frequency signal from a low or medium frequency information signal, comprising:
   pulse-shaping the information signal using sampling having a sampling frequency to form a digital signal having at least two discrete signal values;
   generating for each of the two discrete signal values a corresponding alternating current (AC) radio frequency carrier signal including a first AC radio frequency carrier signal for a first one of the two discrete signal values and a second different AC radio frequency carrier signal for a second one of the two discrete signal values;
   using each discrete signal value to control connecting its corresponding AC radio frequency carrier signal to the output line to produce a switched radio frequency signal carrying the information signal; and
   filtering the switched radio frequency signal for obtaining the high-power modulated radio frequency signal,
   wherein in the step of generating, the different AC radio frequency carrier signals are generated to be different sinusoidal signals.

4. The method according to claim 3, wherein in the step of filtering, a band-pass filtering is made rejecting distortion or an unwanted side band produced by the controlled connecting of the carriers.

5. A method of generating on an output line a high-power modulated radio frequency signal from a low or medium frequency information signal, comprising:
   pulse-shaping the information signal using sampling having a sampling frequency to form a digital signal having at least two discrete signal values;
   generating for each of the two discrete signal values a corresponding alternating current (AC) radio frequency carrier signal including a first AC radio frequency carrier signal for a first one of the two discrete signal values and a second different AC radio frequency carrier signal for a second one of the two discrete signal values;
   using each discrete signal value to control connecting its corresponding AC radio frequency carrier signal to the output line to produce a switched radio frequency signal carrying the information signal; and
   filtering the switched radio frequency signal for obtaining the high-power modulated radio frequency signal,
   wherein in the step of generating, the different AC radio frequency carrier signals are generated as non-sinusoidal signal to be sums of frequency components, all of the components having frequencies being integer multiples of the sampling frequency.

6. The method according to claim 5, wherein in the step of generating, the AC radio frequency carrier signals are generated to stay close to zero for a time period at or around the times at which the connecting of any of the AC radio frequency carrier signals is started or ended.

7. The method according to claim 1, wherein the information signal is quadrature shifted into two components so that, in the step of pulse-shaping, two digital signals are formed, each having at least two discrete signal values, and that in the step of generating, AC radio frequency carrier signals are generated for each of the signal values of the two digital signals, the AC radio frequency carrier signals generated for the signal values of one of the digital signals having a 90 degrees phase-difference in relation to the AC radio frequency carriers generated for the signal values of another of the two digital signals.

8. The method according to claim 7, wherein side-bands associated with the switched radio frequency signal are used as two linearly independent channels as in the quadrature phase I and Q arrangement.

9. The method according to claim 7, wherein when one band-pass filter is used, the signals are added before the filter.

10. The method according to claim 7, wherein the filter(s) is/are (a) band-pass filter(s) rejecting distortion achieved by the amplification.

11. The method according to claim 1, wherein in the step of pulse-shaping, a digital signal having only two signal values is formed.

12. Apparatus for generating a high-power modulated radio frequency signal from a low or medium frequency information signal, comprising:

a quantifier for pulse-shaping, according to a sampling frequency, the information signal to form a digital signal having at least two discrete signal values;

a switching unit connected to the quantifier to receive the digital signal and including multiple alternating current (AC) radio frequency carrier signal generators including a first AC radio frequency carrier signal generator provided for and associated with a first of the at least two discrete signal values and a second AC radio frequency carrier signal generator provided for and associated with a second of the at least two discrete signal values; and a filter connected to an output line of the switching unit for providing the high-power modulated radio frequency signal, wherein the switching unit includes switches for providing a switched radio frequency signal carrying the information content of the information signal, and wherein each of the switches is associated with and controlled by one of the digital signal values to connect the one of the first and second AC radio frequency carrier signal generators associated with the signal value to the output line when the digital signal adopts the respective signal value and to disconnect the one AC radio frequency carrier signal generator when the digital signal does not adopt the respective signal value.

13. The apparatus according to claim 12, wherein the quantifier comprises a sigma-delta modulator.

14. The apparatus according to claim 12, wherein the filter is a band-pass filter for rejecting unwanted signals and distortion achieved by controlled connecting and disconnecting of the AC radio frequency signal generators.

15. The apparatus according to claim 12, wherein the AC radio frequency carrier signal generators includes a transformer coupled to a single AC radio frequency carrier generator element to generate AC radio frequency carrier signal voltages having different amplitudes.

16. The apparatus according to claim 12, wherein the quantifier is configured to generate the digital signal values to connect or disconnect the AC radio frequency carrier signals at times when the AC radio frequency carrier signals have a magnitude at or near zero.

* * * * *